United States Patent
Bai et al.

(10) Patent No.: US 11,070,203 B2
(45) Date of Patent: Jul. 20, 2021

(54) DUAL BOOTSTRAPPING FOR AN OPEN-LOOP PULSE WIDTH MODULATION DRIVER

(71) Applicant: Cirrus Logic International Semiconductor Ltd., Edinburgh (GB)

(72) Inventors: Jing Bai, Austin, TX (US); Tejasvi Das, Austin, TX (US); Xin Zhao, Austin, TX (US); Lei Zhu, Austin, TX (US); Xiaofan Fei, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/162,960

(22) Filed: Oct. 17, 2018

(65) Prior Publication Data
US 2019/0260377 A1 Aug. 22, 2019

Related U.S. Application Data

(60) Provisional application No. 62/632,291, filed on Feb. 19, 2018.

(51) Int. Cl.
*H03K 17/687* (2006.01)
*G06F 3/01* (2006.01)
(Continued)

(52) U.S. Cl.
CPC ......... *H03K 17/6871* (2013.01); *G06F 3/016* (2013.01); *H03F 3/183* (2013.01);
(Continued)

(58) Field of Classification Search
CPC ....... H03K 19/00361; H03K 19/00315; H03K 19/01714; H03K 17/063; H03K 17/04126;
(Continued)

(56) References Cited

U.S. PATENT DOCUMENTS 8,310,284 B2 * 11/2012 Heck .................... H03K 17/063
327/108
9,729,135 B2 * 8/2017 Yamaguchi .......... H03K 17/163
(Continued)

FOREIGN PATENT DOCUMENTS

EP 3136596 A1 3/2017
WO 2011096175 A1 8/2011

OTHER PUBLICATIONS

International Search Report and Written Opinion of the International Searching Authority, International Application No. PCT/US2019/015795, dated Apr. 17, 2019.
(Continued)

*Primary Examiner* — Long Nguyen
(74) *Attorney, Agent, or Firm* — Jackson Walker L.L.P.

(57) ABSTRACT

A driver system may include a first n-type field-effect transistor coupled at its non-gate terminals between an output of the driver system and a first terminal of a supply voltage and configured to drive the output when the first n-type field-effect transistor is activated, a second n-type field-effect transistor coupled at its non-gate terminals between an output of the driver system and a second terminal of the supply voltage and configured to drive the output when the second n-type field-effect transistor is activated, a high-side capacitor coupled to the output of the driver system, and a low-side capacitor coupled to the second terminal of the supply voltage, wherein the high-side capacitor and the low-side capacitor are configured to track and correct for mismatches between a first resistance of the first n-type field-effect transistor and a second resistance of the second n-type field-effect transistor.

10 Claims, 5 Drawing Sheets

(51) Int. Cl.
    *H03K 17/06* (2006.01)
    *H03K 19/0175* (2006.01)
    *H03K 19/0185* (2006.01)
    *H03F 3/217* (2006.01)
    *H03F 3/183* (2006.01)
    *H04R 3/12* (2006.01)

(52) U.S. Cl.
    CPC ......... *H03F 3/2173* (2013.01); *H03K 17/063* (2013.01); *H03K 19/0185* (2013.01); *H03K 19/017545* (2013.01); *H03K 19/018557* (2013.01); *H04R 3/12* (2013.01)

(58) Field of Classification Search
    CPC ............ H03K 5/02; H03K 5/12; H03K 5/023; H03K 19/096; H03K 17/162; H03K 17/687; H03K 17/6871; H03K 3/01; H03K 17/165; H03K 17/04123; H03K 17/0416; H03K 17/04163; H03K 19/017545; H03K 19/0185; H03K 19/018557; G06F 3/016; H04R 3/12; H04R 3/00; H03F 3/2173; H03F 3/217; H03F 3/183; H03F 3/185
See application file for complete search history.

(56) References Cited

U.S. PATENT DOCUMENTS

2008/0252372 A1   10/2008  Williams
2016/0028219 A1    1/2016  Habu et al.

OTHER PUBLICATIONS

Ye, Zichao et al, "A power supply circuit for gate driver of GaN-based flying capacitor multi-level converters", 2016 IEEE 4th Workshop on Wide Bandgap Power Devices and Applications (WIPDA), Nov. 7, 2016, pp. 53-58.

* cited by examiner

DUAL BOOTSTRAPPING FOR AN OPEN-LOOP PULSE WIDTH MODULATION DRIVER

RELATED APPLICATION

The present disclosure claims priority to U.S. Provisional Patent Application Ser. No. 62/632,291, filed Feb. 19, 2018, which is incorporated by reference herein in its entirety.

FIELD OF DISCLOSURE

The present disclosure relates in general to circuits for audio and haptic devices, including without limitation personal audio devices, such as wireless telephones and media players, or devices comprising a haptic module.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a class-D amplifier. A class-D amplifier (also known as a "switching amplifier") may comprise an electronic amplifier in which the amplifying devices (e.g., transistors, typically metal-oxide-semiconductor field effect transistors) operate as electronic switches. In a class-D amplifier, a signal to be amplified may be converted to a series of pulses by pulse-width modulation (PWM), pulse-density modulation, or another method of modulation, such that the signal is converted into a modulated signal in which a characteristic of the pulses of the modulated signal (e.g., pulse widths, pulse density, etc.) is a function of the magnitude of the signal. After amplification with a class-D amplifier, the output pulse train may be converted to an unmodulated analog signal by passing through a passive low-pass filter, wherein such low-pass filter may be inherent in the class-D amplifier or a load driven by the class-D amplifier. Class-D amplifiers are often used due to the fact that they may be more power efficient than linear analog amplifiers, in that class-D amplifiers may dissipate less power as heat in active devices as compared to linear analog amplifiers.

Typically, a closed-loop PWM amplifier is chosen in order to provide accurate load voltage with desirable Total Harmonic Distortion (THD) and Power Supply Rejection Ratio (PSRR). A closed-loop PWM amplifier typically takes an analog voltage input and a sensed feedback voltage signal which are fed through a closed-loop analog PWM modulator to drive voltage on the speaker load.

An option to alternatively drive loads using a single PWM amplifier circuit in either open-loop or closed-loop depending on the specific application may be desirable. However, traditional open-loop PWM amplifiers are known to have high non-linearity due to lack of a feedback loop. Such non-linearity may be caused by mismatch between a high-side device (e.g., a device for driving an output of the driver to a first voltage) and a low-side driver (e.g., a device for driving an output of the driver to a second voltage, such as ground, lower than the first voltage). In traditional approaches, open-loop drivers are often implemented using an inverter formed by a p-type field-effect transistor and an n-type field-effect transistor, and matching p-type and n-type devices is often difficult, particularly over process, voltage, and temperature corners. Such linearity may also be caused by mismatch between positive polarity side and negative polarity side in a differential driver (e.g., an H-bridge driver). The presence of nonlinearity may increase total harmonic distortion and also cause the mixing of high-frequency out-of-band noise with in-band content, increasing the in-band noise floor of the driver.

Accordingly, systems and methods to reduce or eliminate non-linearity in open-loop pulse-width modulation drivers are desired.

SUMMARY

In accordance with the teachings of the present disclosure, one or more disadvantages and problems associated with existing approaches to processing signals with an amplifier may be reduced or eliminated.

In accordance with embodiments of the present disclosure, a driver system may include a first n-type field-effect transistor coupled at its non-gate terminals between an output of the driver system and a first terminal of a supply voltage and configured to drive the output when the first n-type field-effect transistor is activated, a second n-type field-effect transistor coupled at its non-gate terminals between an output of the driver system and a second terminal of the supply voltage and configured to drive the output when the second n-type field-effect transistor is activated, a high-side capacitor coupled to the output of the driver system, and a low-side capacitor coupled to the second terminal of the supply voltage, wherein the high-side capacitor and the low-side capacitor are configured to track and correct for mismatches between a first resistance of the first n-type field-effect transistor and a second resistance of the second n-type field-effect transistor.

In accordance with these and other embodiments of the present disclosure, a method may be provided for use in a driver system comprising a first n-type field-effect transistor coupled at its non-gate terminals between an output of the driver system and a first terminal of a supply voltage and configured to drive the output when the first n-type field-effect transistor is activated, a second n-type field-effect transistor coupled at its non-gate terminals between an output of the driver system and a second terminal of the supply voltage and configured to drive the output when the second n-type field-effect transistor is activated, a high-side capacitor coupled to the output of the driver system, and a low-side capacitor coupled to the second terminal of the supply voltage. The method may include tracking, by the high-side capacitor and the low-side capacitor, mismatches between a first resistance of the first n-type field-effect transistor and a second resistance of the second n-type field-effect transistor, and correcting, by the high-side capacitor and the low-side capacitor, the mismatches.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
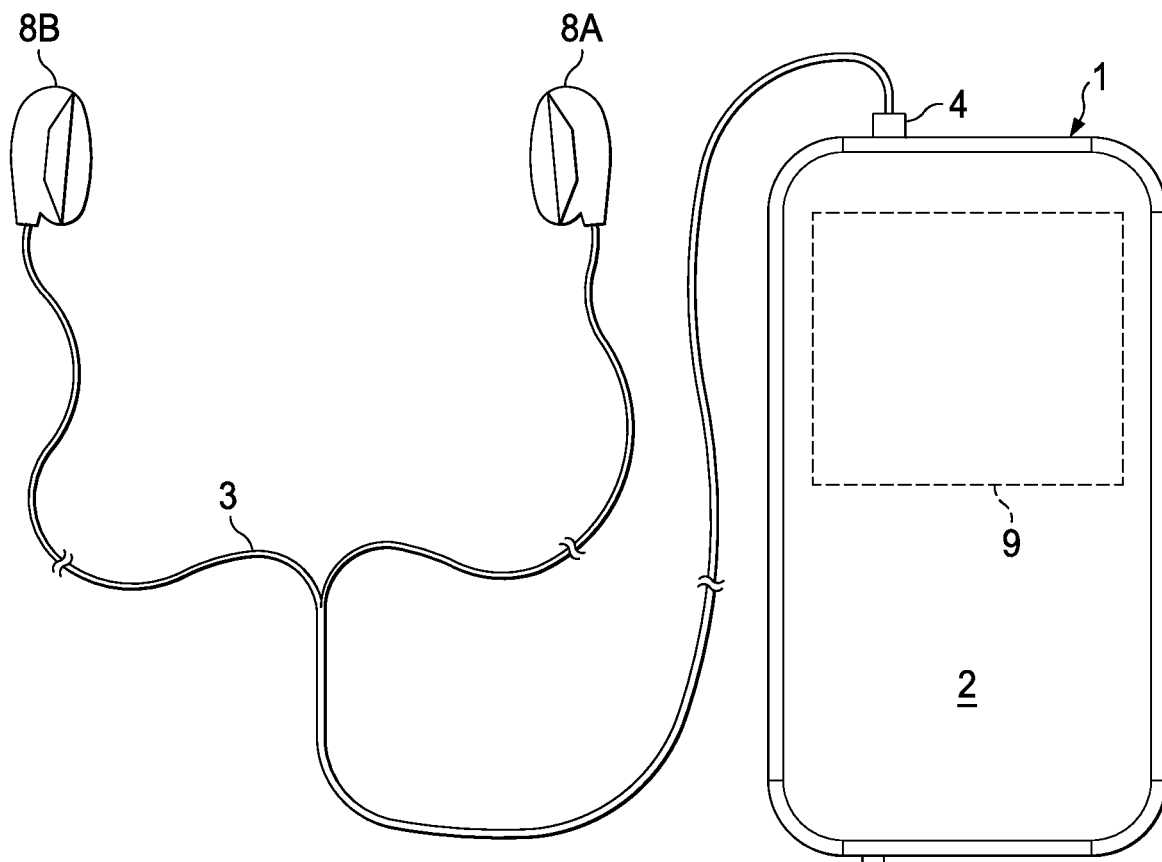
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer (e.g., a loudspeaker).

Figure 2:
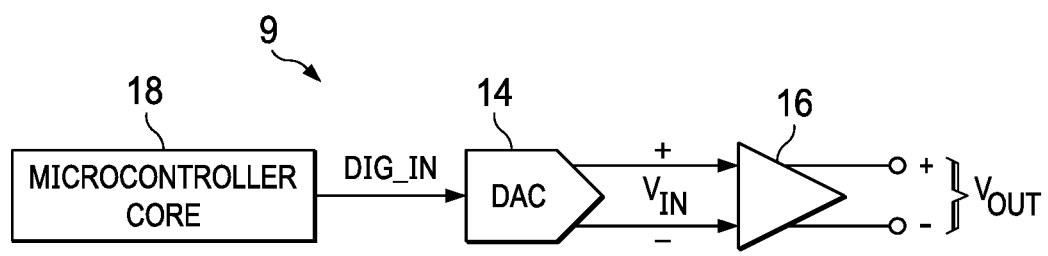
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 (e.g., a digital signal processor or "DSP") may supply a digital audio input signal DIG_IN to a digital-to-analog converter (DAC) 14, which may convert the digital audio input signal to an analog input signal $V_{IN}$. DAC 14 may supply analog signal $V_{IN}$ to an amplifier 16 which may amplify or attenuate analog input signal $V_{IN}$ to provide an audio output signal $V_{OUT}$, which may operate a speaker, headphone transducer, a line level signal output, and/or other suitable output.

Figure 3:
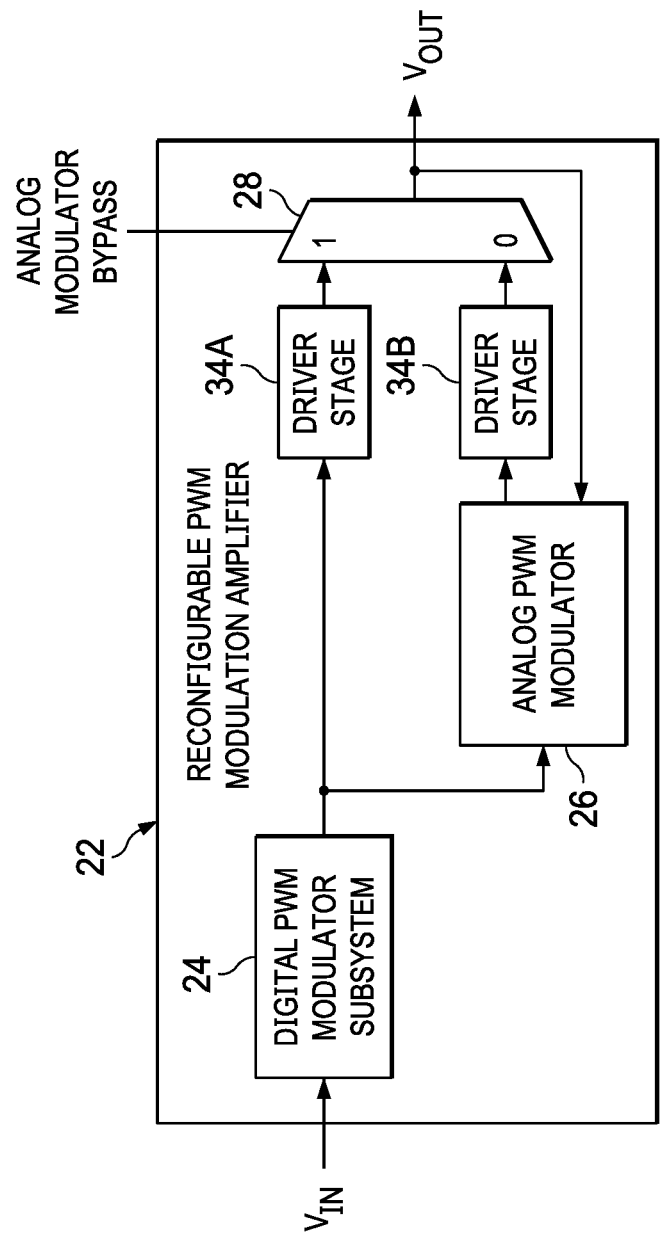
FIG. 3 is a block diagram of selected components of an example reconfigurable PWM modulator, in accordance with embodiments of the present disclosure.

FIG. 3 is a block diagram of selected components of an example reconfigurable pulse width modulation amplifier 22, in accordance with embodiments of the present disclosure. In some embodiments, example reconfigurable pulse width modulation amplifier 22 may be used to implement amplifier 16 of FIG. 2. As shown in FIG. 3, example reconfigurable pulse width modulation amplifier 22 may include a digital PWM modulator subsystem 24 and an analog PWM modulator 26, along with a direct bypass function implemented with a multiplexer 28.

Reconfigurable PWM modulation amplifier 22 may be configured to operate in an analog closed-loop mode through the use of analog PWM modulator 26 when the ANALOG MODULATOR BYPASS control signal received by multiplexer 28 is deasserted. In the analog closed-loop mode, input signal $V_{IN}$ may be modulated by digital PWM modulator subsystem 24, analog PWM modulator 26 may receive its input from digital PWM modulator subsystem 24, and analog PWM modulator 26 may be utilized such that the output of analog PWM modulator 26, as received and driven by driver stage 34B, is driven as output signal $V_{OUT}$. Driver stage 34B may comprise a plurality of output switches configured to generate output signal $V_{OUT}$ from a modulated signal generated by analog PWM modulator 26.

Reconfigurable PWM modulation amplifier 22 may also be configured to operate in a digital open-loop mode through the use of digital PWM modulator subsystem 24 when the ANALOG MODULATOR BYPASS control signal received by multiplexer 28 is asserted. In the digital open-loop mode, analog PWM modulator 26 and a driver stage 34B driven by analog PWM modulator 26 may be bypassed by multiplexer 28, and digital PWM modulator subsystem 24 may be utilized such that input signal $V_{IN}$ is modulated by digital PWM modulator subsystem 24 and the output of digital PWM modulator subsystem 24, as received and driven by an open-loop driver stage 34A, is driven as output signal $V_{OUT}$. Driver stage 34A may comprise a plurality of output switches configured to generate output signal $V_{OUT}$ from a modulated signal generated by digital PWM modulator subsystem 24.

Changing reconfigurable PWM modulation amplifier 22 from the analog closed-loop mode and the digital open-loop mode (and vice versa) may be achieved by, through use of multiplexer 28, selecting which of driver stage 34A and driver stage 34B is to drive output signal $V_{OUT}$.

In some embodiments, a control circuit (not shown) may be used to control multiplexer 28 in order to select a signal processing path for reconfigurable PWM modulation amplifier 22. For example, selection of such multiplexer control signal may be based on one or more characteristics of input signal $V_{IN}$ to the amplifier (e.g., signal magnitude, signal peak, signal envelope, signal frequency, or other characteristic of input signal $V_{IN}$). Thus, reconfigurable PWM modulation amplifier 22 may comprise a digital pulse width modulator subsystem (e.g., digital PWM modulator subsystem 24), a first path coupled to an output of the digital pulse width modulator subsystem and configured to drive an open-loop driver stage (e.g., driver stage 34A), and a second path coupled to the output of the digital pulse width modulator subsystem and configured to drive a closed-loop analog pulse width modulator (e.g., analog PWM modulator 26), wherein one of the first path and the second path is selected for processing a signal based on one or more characteristics of the signal (e.g., signal magnitude, signal peak, signal envelope, signal frequency, or other characteristic of input signal $V_{IN}$). In embodiments in which input signal $V_{IN}$ is an audio signal, selection of the path for processing may be based not only on characteristics of the audio signal within an audible band of frequencies, but also the characteristics of out-of-band components of the signal that propagate to output signal $V_{OUT}$.

Figure 4:
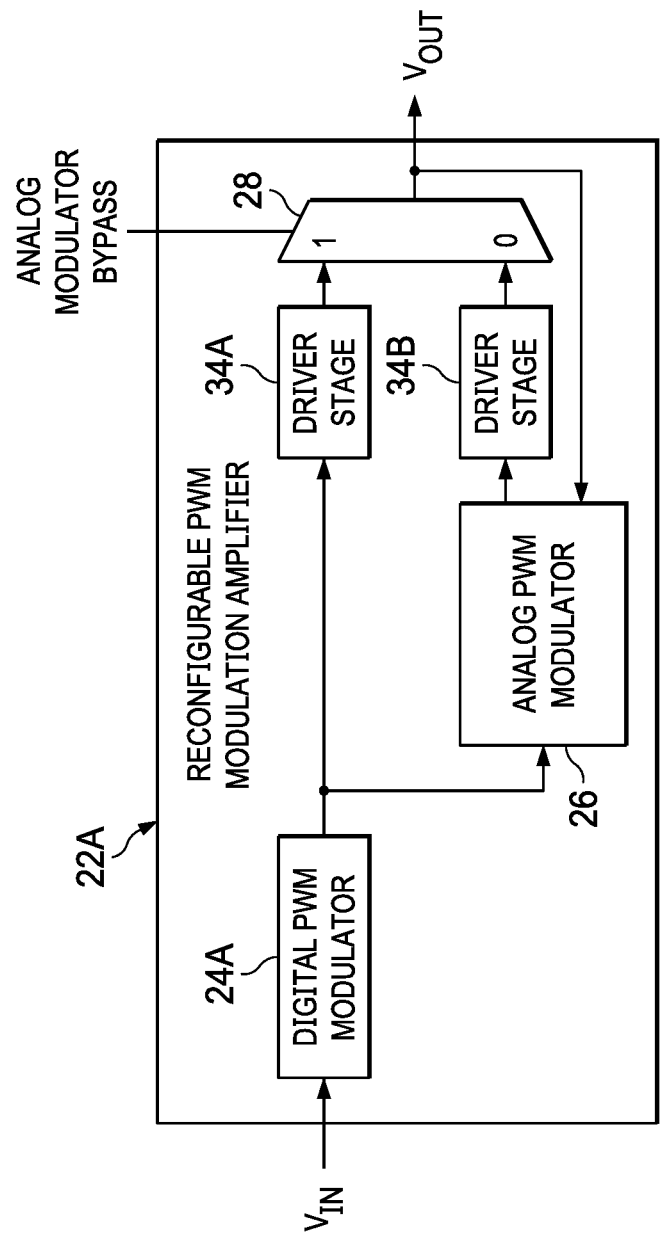
FIG. 4 is a block diagram of selected components of an example reconfigurable PWM modulator, including components for calibrating path gains, in accordance with embodiments of the present disclosure.

FIG. 4 is a block diagram of selected components of an example reconfigurable PWM modulation amplifier 22A, in accordance with embodiments of the present disclosure. In some embodiments, reconfigurable PWM modulation amplifier 22A may be used to implement reconfigurable PWM modulation amplifier 22 of FIG. 3. As shown in FIG. 4, a single digital PWM modulator 24A may be used to implement digital PWM modulator subsystem 24

Figure 5:
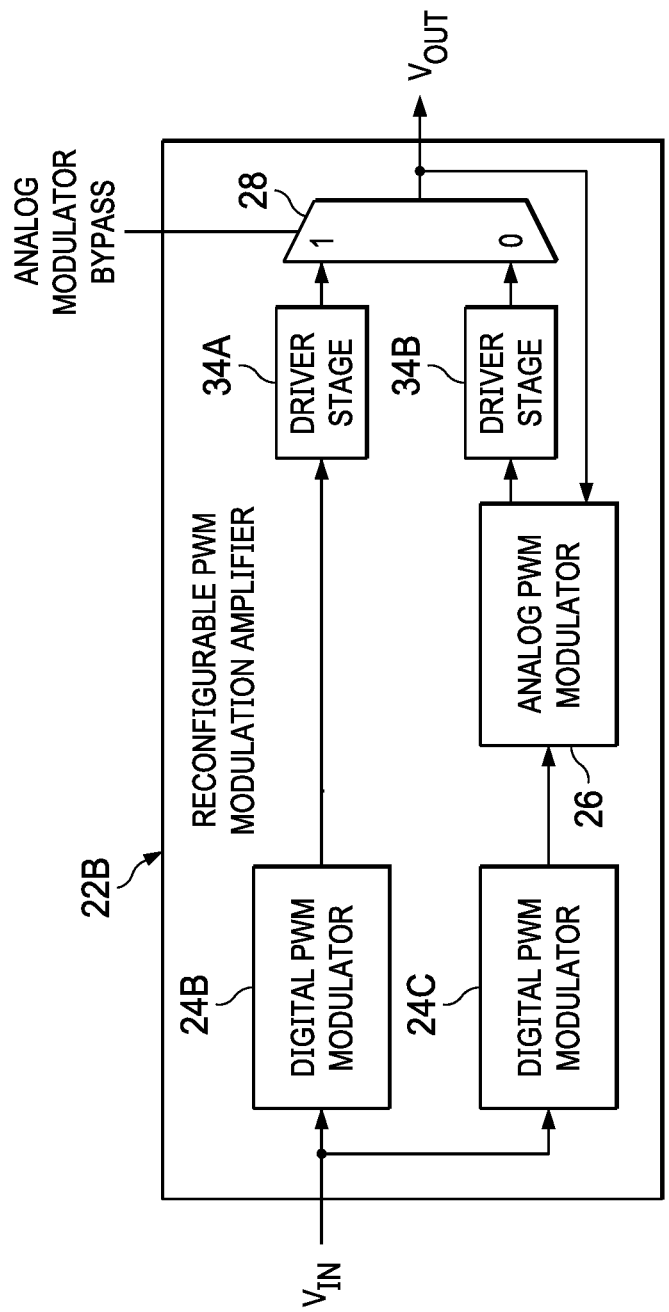
FIG. 5 is a block diagram of selected components of another example reconfigurable PWM modulator, including components for calibrating path gains, in accordance with embodiments of the present disclosure.

FIG. 5 is a block diagram of selected components of an example reconfigurable PWM modulation amplifier 22B, in accordance with embodiments of the present disclosure. In some embodiments, reconfigurable PWM modulation amplifier 22B may be used to implement reconfigurable PWM modulation amplifier 22 of FIG. 3. As shown in FIG. 5, digital PWM modulation subsystem 24 of FIG. 2 may be implemented using a first digital PWM modulator 24B and a second digital PWM modulator subsystem 24C. Digital PWM modulator 24B may drive open-loop driver stage 34A while digital PWM modulator 24C may drive analog PWM modulator 26.

Although FIGS. 3-5 depict multiplexer 28 configured to select between passing the output of driver stage 34A and passing the output of driver stage 34B as output signal $V_{OUT}$, those of skill in the art will recognize that any other suitable circuit, system, device, or apparatus may be used in addition to or in lieu of multiplexer 28 in order to select between passing the output of driver stage 34A and passing the output of driver stage 34B as output signal $V_{OUT}$. As a non-limiting example, in some embodiments, driver stages 34A and 34B may have tri-stated outputs that together may be configured to perform functionally equivalent to multiplexer 28.

Advantageously, the foregoing provides systems and methods for implementing and using a system comprising a reconfigurable amplifier capable of switching between an analog closed-loop modulation amplifier and a digital open-loop modulation amplifier with minimal additional digital logic as compared to that of existing amplifier systems.

Figure 6:
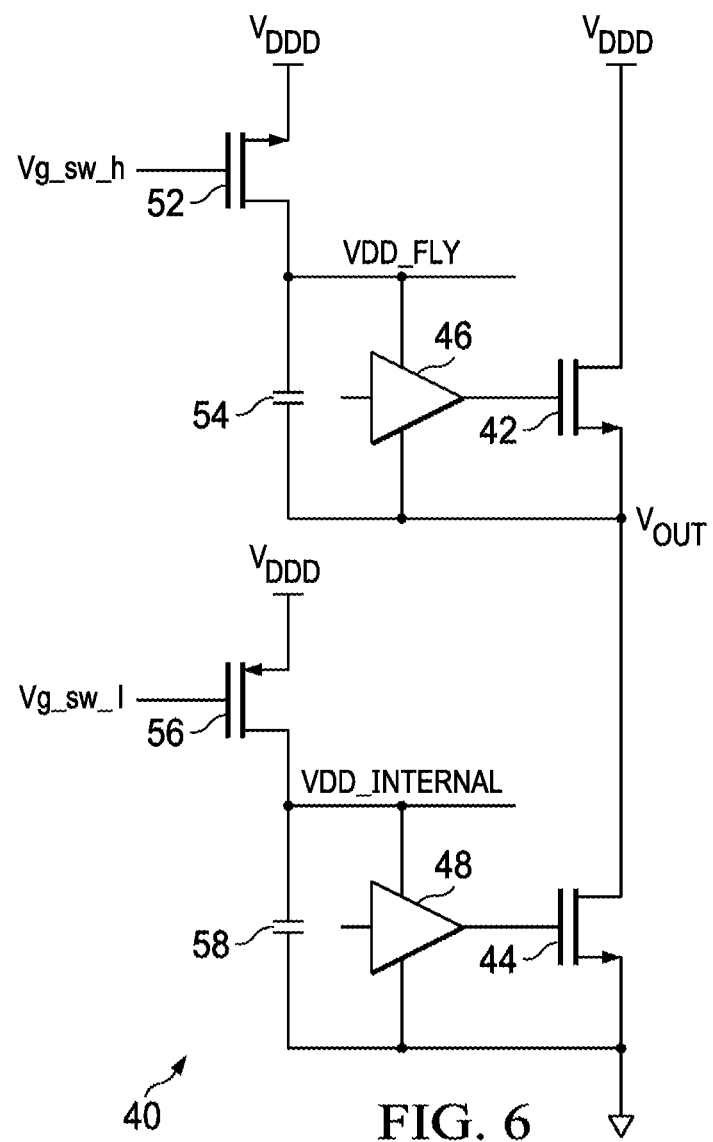
FIG. 6 is a block diagram of selected components of an open-loop pulse-width modulation driver, in accordance with embodiments of the present disclosure.

FIG. 6 is a block diagram of selected components of an open-loop PWM driver stage 40, in accordance with embodiments of the present disclosure. In some embodiments, open-loop PWM driver stage 40 may be used to implement all or a portion of driver stage 34A of FIGS. 3-5. As shown in FIG. 6, open-loop PWM driver stage 40 may be implemented with an output driver using two n-type metal-oxide-semiconductor field-effect transistors (n-MOSFETs) including a high-side n-MOSFET 42 and a low-side n-MOSFET 44. High-side n-MOSFET 42 may be coupled at its drain terminal to a first terminal of a voltage supply (e.g., to voltage $V_{DDD}$), coupled at its source terminal to an output node of open-loop PWM driver stage 40, and coupled at its gate terminal to the output of a high-side predriver 46. Low-side n-MOSFET 44 may be coupled at its drain terminal to the output node of open-loop PWM driver stage 40, coupled at its source terminal to a second terminal of a voltage supply (e.g., to a ground voltage), and coupled at its gate terminal to the output of a low-side predriver 48.

Open-loop PWM driver stage 40 may also include a high-side bootstrap n-MOSFET 52 coupled at its source terminal to the first terminal of the voltage supply (e.g., $V_{DDD}$), coupled at its drain terminal to a first terminal of a high-side bootstrap capacitor 54, and coupled at its gate to a high-side switching signal Vg_sw_h. High-side bootstrap capacitor 54 may further be coupled at its second terminal to the output node of open-loop PWM driver stage 40. As a result, high-side predriver 46 may be coupled via its differential voltage supply inputs to respective terminals of high-side bootstrap capacitor 54. In operation, the gate terminal of high-side predriver 46 may be driven by an inverse of a PWM input signal to open-loop PWM driver stage 40, wherein such inverse PWM input signal is level shifted between a voltage VDD_FLY and output voltage $V_{OUT}$.

Open-loop PWM driver stage 40 may also include a low-side bootstrap p-type metal-oxide-semiconductor field-effect transistor (p-MOSFET) 56 coupled at its source terminal to the first terminal of the voltage supply (e.g., $V_{DDD}$), coupled at its drain terminal to a first terminal of a low-side bootstrap capacitor 58, and coupled at its gate to a low-side switching signal Vg_sw_l which may be a complement to high-side switching signal Vg_sw_h. Each of low-side switching signal Vg_sw_l and high-side switching signal Vg_sw_h may be PWM input waveforms. The maximum voltage of high-side switching signal Vg_sw_h may be level shifted or pumped to a level above the sum of voltage $V_{DDD}$ and a threshold voltage of high-side bootstrap n-MOSFET 52 in order to fully activate high-side bootstrap n-MOSFET 52, and its minimum voltage should be below voltage $V_{DDD}$ in order to completely deactivate high-side bootstrap n-MOSFET 52. Low-side bootstrap capacitor 58 may further be coupled at its second terminal to the second terminal of the voltage supply (e.g., ground voltage). As a result, low-side predriver 48 may be coupled via its differential voltage supply inputs to respective terminals of low-side bootstrap capacitor 58. In operation, the gate terminal of low-side predriver 48 may be driven by the PWM input signal to open-loop PWM driver stage 40.

VDD_FLY represents a voltage present at the electrical node common to the drain terminal of high-side bootstrap n-MOSFET 52 and the first terminal of a high-side bootstrap capacitor 54, and VDD_INTERNAL represents a voltage present at the electrical node common to the drain terminal of low-side bootstrap p-MOSFET 56 and the first terminal of a low-side bootstrap capacitor 58. Thus, those of skill in the art may recognize that in operation, when output voltage $V_{OUT}$ rises from zero to $V_{DDD}$, voltage VDD_FLY will not be actively driven by high-side bootstrap n-MOSFET 52 and will rise by an amount approximately equal to the supply voltage $V_{DDD}$ from a first voltage (e.g., voltage $V_{DDD}$ minus a threshold voltage $V_{TH1}$ of high-side bootstrap n-MOSFET 52) to a second voltage (e.g., voltage $2V_{DDD}$ minus a threshold voltage $V_{TH2}$ of low-side bootstrap p-MOSFET 56). Further, those of skill in the art may recognize that threshold voltage $V_{TH1}$ may vary based on process differences, supply voltage $V_{DDD}$, temperature of open-loop pulse-width modulation driver stage 40, and/or other conditions. In addition, those of skill in the art may recognize that in operation, voltage VDD_INTERNAL may remain at a relatively constant voltage (e.g., voltage $V_{DDD}$ minus a threshold voltage $V_{TH2}$ of low-side bootstrap p-MOSFET 56), varying only as threshold voltage $V_{TH2}$ varies in a manner similar to threshold voltage $V_{TH1}$ based on process differences, supply voltage $V_{DDD}$, temperature of open-loop pulse-width modulation driver stage 40, and/or other conditions.

The various high-side components (e.g., high-side n-MOSFET 42, high-side bootstrap n-MOSFET 52, high-side predriver 46, high-side bootstrap capacitor 54) may be matched to have approximately identical process parameters to that of the various low-side components (e.g., low-side n-MOSFET 44, low-side bootstrap p-MOSFET 56, low-side predriver 48, low-side bootstrap capacitor 58) during fabrication of open-loop pulse-width modulation driver stage 40, so that high-side components and low-side components experience approximately the same variation with process, supply voltage, temperature, and other parameters.

During operation, the gate-to-source voltages of high-side n-MOSFET 42 and low-side n-MOSFET 44 should remain matched. As a result, high-side bootstrap capacitor 54 and the low-side bootstrap capacitor 58 may be configured to track and correct for mismatches between a drain-to-source resistance of high-side n-MOSFET 42 when high-side n-MOSFET 42 is activated and a drain-to-source resistance of low-side n-MOSFET 44 when low-side n-MOSFET 44 is activated.

In addition, high-side bootstrap capacitor 54 may track any offset that may occur at the gate terminal of high-side n-MOSFET 42 as well as offsets occurring at the output node of open-loop pulse-width modulation driver stage 40. Furthermore, low-side bootstrap capacitor 58 may track any offset that may occur at the gate terminal of low-side n-MOSFET 44, track any offset that may occur at the gate terminal of high-side n-MOSFET 42, and may correct for one or both of these offsets at the output node of open-loop pulse-width modulation driver stage 40. Accordingly: (i) high-side bootstrap capacitor 54 tracks a first offset occurring at the gate terminal of high-side n-MOSFET 42 and corrects for the first offset at the output node of open-loop pulse-width modulation driver stage 40; (ii) low-side bootstrap capacitor 58 tracks a second offset occurring at the gate terminal of low-side n-MOSFET 44 and corrects for the second offset at the output node of open-loop pulse-width modulation driver stage 40; and (iii) low-side bootstrap capacitor 58 tracks the second offset in a manner that corrects for the first offset.

Further, the tracking and correcting for the offsets is implemented by controlling at least one of high-side n-MOSFET 42 and low-side n-MOSFET 44 during and after each edge transition of output signal $V_{OUT}$ at the output node of open-loop pulse-width modulation driver stage 40. Such control may include controlling the drain-to-source resistance of high-side n-MOSFET 42 during a first edge transition of output signal $V_{OUT}$ based on voltage feedback through the gate terminal of high-side n-MOSFET 42 and/or current feedback through the output node of open-loop pulse-width modulation driver stage 40. In addition or alternatively, such control may include controlling the drain-to-source resistance of low-side n-MOSFET 44 during a second edge transition of output signal $V_{OUT}$ based on voltage feedback through the gate terminal of low-side n-MOSFET 44 and/or current feedback through the output node of open-loop pulse-width modulation driver stage 40. In addition or alternatively, the controlling after an edge transition controls at least one of the first resistance and the second resistance in order to correct for mismatches between the drain-to-source resistance of high-side n-MOSFET 42 and the drain-to-source resistance of low-side n-MOSFET 44.

Although FIG. 6 shows high-side n-MOSFET 42, high-side bootstrap n-MOSFET 52, and low-side bootstrap p-MOSFET 56 all coupled to the same supply voltage $V_{DDD}$, in some embodiments, high-side bootstrap n-MOSFET 52 and low-side bootstrap p-MOSFET 56 may be coupled to a source voltage different than that coupled to high-side n-MOSFET 42.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A driver system comprising:
   a first n-type field-effect transistor coupled at its non-gate terminals between an output of the driver system and a first terminal of a supply voltage and configured to drive the output when the first n-type field-effect transistor is activated;

a second n-type field-effect transistor coupled at its non-gate terminals between the output of the driver system and a second terminal of the supply voltage and configured to drive the output when the second n-type field-effect transistor is activated;

a high-side capacitor coupled to the output of the driver system;

a high-side bootstrap switch coupled at its non-gate terminals between a second supply voltage and the high-side capacitor such that the high-side capacitor is coupled between the high-side bootstrap switch and the output;

a high-side predriver configured to drive the gate of the first n-type field-effect transistor wherein respective power supply terminals of the high-side predriver are coupled to respective terminals of the high-side capacitor;

a low-side capacitor coupled to the second terminal of the supply voltage;

a low-side bootstrap switch coupled at its non-gate terminals between the second supply voltage and the low-side capacitor such that the low-side capacitor is coupled between the low-side bootstrap switch and the second terminal of the supply voltage;

a low-side predriver configured to drive the gate of the second n-type field-effect transistor wherein respective power supply terminals of the low-side predriver are coupled to respective terminals of the low-side capacitor;

wherein the high-side capacitor and the low-side capacitor are configured to track and correct for mismatches between a first resistance of the first n-type field-effect transistor and a second resistance of the second n-type field-effect transistor by controlling, via a control circuit that includes the high-side predriver and the low-side predriver, at least one of the first n-type field-effect transistor and the second n-type field-effect transistor.

2. The driver system of claim 1, wherein the high-side capacitor is further configured to track a first offset occurring at a gate terminal of the first n-type field-effect transistor and corrects for the first offset at the output.

3. The driver system of claim 2, wherein the low-side capacitor is further configured to track a second offset occurring at a gate terminal of the second n-type field-effect transistor and correct for the second offset at the output.

4. The driver system of claim 3, wherein the low-side capacitor is further configured to track the second offset in a manner that corrects for the first offset.

5. The driver system of claim 1, wherein the supply voltage and the second supply voltage are a same voltage.

6. A method comprising, in a driver system comprising a first n-type field-effect transistor coupled at its non-gate terminals between an output of the driver system and a first terminal of a supply voltage and configured to drive the output when the first n-type field-effect transistor is activated, a second n-type field-effect transistor coupled at its non-gate terminals between the output of the driver system and a second terminal of the supply voltage and configured to drive the output when the second n-type field-effect transistor is activated, a high-side capacitor coupled to the output of the driver system, and a low-side capacitor coupled to the second terminal of the supply voltage:

tracking, by the high-side capacitor and the low-side capacitor, mismatches between a first resistance of the first n-type field-effect transistor and a second resistance of the second n-type field-effect transistor; and correcting, by the high-side capacitor and the low-side capacitor, the mismatches by controlling, via a control circuit, at least one of the first n-type field-effect transistor and the second n-type field-effect transistor;

wherein the driver system further includes:

a high-side bootstrap switch coupled at its non-gate terminals between a second supply voltage and the high-side capacitor such that the high-side capacitor is coupled between the high-side bootstrap switch and the output;

a high-side predriver configured to drive the gate of the first n-type field-effect transistor wherein respective power supply terminals of the high-side predriver are coupled to respective terminals of the high-side capacitor;

a low-side bootstrap switch coupled at its non-gate terminals between the second supply voltage and the low-side capacitor such that the low-side capacitor is coupled between the low-side bootstrap switch and the second terminal of the supply voltage; and a low-side predriver configured to drive the gate of the second n-type field-effect transistor wherein respective power supply terminals of the low-side predriver are coupled to respective terminals of the low-side capacitor;

wherein the control circuit includes the high-side predriver and the low-side predriver.

7. The method of claim 6, further comprising:

tracking, by the high-side capacitor, a first offset occurring at a gate terminal of the first n-type field-effect transistor; and correcting, by the high-side capacitor, the first offset at the output.

8. The method of claim 7, further comprising:

tracking, by the low-side capacitor, a second offset occurring at a gate terminal of the second n-type field-effect transistor; and correcting, by the low-side capacitor, the second offset at the output.

9. The method of claim 8, further comprising tracking, by the low-side capacitor, the second offset in a manner that corrects for the first offset.

10. The method of claim 6, wherein the supply voltage and the second supply voltage are a same voltage.

* * * * *